(12) United States Patent
Lai et al.

(10) Patent No.: US 7,520,313 B2
(45) Date of Patent: Apr. 21, 2009

(54) LOCKING DEVICE FOR HEAT SINK

(75) Inventors: Cheng-Tien Lai, Guangdong (CN); Zhi-Yong Zhou, Guangdong (CN); Jian Hu, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 322 days.

(21) Appl. No.: 11/308,332

(22) Filed: Mar. 16, 2006

(65) Prior Publication Data

US 2007/0217158 A1 Sep. 20, 2007

(51) Int. Cl.
*F28F 9/00* (2006.01)
*F28F 7/00* (2006.01)
*H05K 7/20* (2006.01)

(52) U.S. Cl. .................. 165/80.3; 165/80.2; 165/67

(58) Field of Classification Search ............... 165/80.3, 165/67, 76, 78, 79, 104.34, 185; 361/704, 361/709, 719; 257/718, 719; 24/458, 459, 24/503–508, 544
See application file for complete search history.

(56) References Cited

U.S. PATENT DOCUMENTS

| 5,493,475 | A | * | 2/1996 | Lin | 361/710 |
| 5,638,258 | A | * | 6/1997 | Lin | 361/704 |
| 6,250,375 | B1 | * | 6/2001 | Lee et al. | 165/80.3 |
| 6,449,154 | B1 | * | 9/2002 | Yoneyama et al. | 361/704 |
| 6,662,412 | B2 | * | 12/2003 | Chuang et al. | 24/457 |
| 6,924,984 | B2 | * | 8/2005 | Lee et al. | 361/704 |
| 7,019,978 | B2 | * | 3/2006 | Zhou et al. | 361/704 |
| 7,106,591 | B2 | * | 9/2006 | Fan et al. | 361/704 |
| 7,218,520 | B2 | * | 5/2007 | Li et al. | 361/704 |
| 7,327,575 | B2 | * | 2/2008 | Yu et al. | 361/719 |
| 7,331,756 | B2 | * | 2/2008 | Watanabe et al. | 415/191 |
| 7,333,333 | B2 | * | 2/2008 | Zhao et al. | 361/700 |

FOREIGN PATENT DOCUMENTS

| TW | 566829 | 12/2003 |
| TW | 246674 | 10/2004 |
| TW | 254065 | 12/2004 |

* cited by examiner

*Primary Examiner*—Tho v Duong
(74) *Attorney, Agent, or Firm*—Winston Hsu

(57) ABSTRACT

A locking device (100) used for securing a heat sink (10) to a heat-generating component in accordance with an embodiment includes a pair of retainers (20). The locking device cooperates with a retention frame (30) to secure the heat sink to the heat-generating component. Each retainer (20) includes a handle (22) and a locking leg (24). The handle is pivotably mounted to fins of the heat sink via a pivot (225). The locking leg is made from a unitary sheet member and is connected to the handle at a location spaced apart from the pivot via which the handle is mounted to the heat sink. When the handle is brought to pivot about the pivot, the locking leg is driven to move in a direction to engage with the retention frame whereby the heat sink is firmly secured to the heat-generating component.

7 Claims, 6 Drawing Sheets

LOCKING DEVICE FOR HEAT SINK

FIELD OF THE INVENTION

The present invention relates generally to heat sink assemblies for use with heat sources, and more particularly to a locking device for securing a heat sink to a heat-generating component such as an electronic component of a computer system.

DESCRIPTION OF RELATED ART

It is well known that electronic components such as processors of computers generate large amount of heat during normal operations. The generated heat must be adequately dissipated from these heat-generating electronic components to enable them to operate normally in an acceptable temperature range. Cooling of a processor is generally achieved by thermally attaching a heat sink to the processor so that the heat generated by the processor is dissipated by the heat sink.

Keeping the heat sink attached so as to maintain an intimate contact with the processor being cooled can significantly reduce the thermal resistance existing between the processor and the heat sink, and accordingly the processor is cooled more efficiently. To securely and intimately attach the heat sink to the processor, a locking device is generally required. Currently, a variety of locking devices have been developed for the purpose of securing heat sinks to electronic components which require cooling. Although acceptable in securing the heat sinks to the electronic components, these conventional locking devices still have at least the disadvantages enumerated below:

(1) The prior art locking devices generally have a complicated structure, which adds correspondingly to the cost of heat sink assembly when including the locking device.

(2) A locking device is generally required to be user-friendly, e.g., to be easy to operate and to require little force to secure a heat sink with the locking device. The prior art locking devices, however, generally cannot satisfy this requirement.

(3) Conventional locking devices often have a large volume or profile and hence require a relatively large mounting space for disposing of the locking device, in which case the heat sink being secured may be required to sacrifice a portion of its heat dissipation surface area in order to make room for accommodating the locking device.

Therefore, it is desirable to provide a locking device used for securing a heat sink which overcomes the foregoing disadvantages.

SUMMARY OF INVENTION

The present invention relates to a locking device used for securing a heat sink to a heat-generating component. The locking device includes a pair of retainers. Each retainer includes a handle and a locking leg. The handle includes a positioning end portion and an operational end portion extending from the positioning end portion. The positioning end portion of the handle is provided with a pivot and the handle is pivotable around the pivot. The locking leg is made from a unitary sheet member and includes a first engaging means provided at a first end portion thereof. A second end portion of the locking leg is connected to the positioning end portion of the handle at a location spaced apart from the pivot. When the handle is brought to pivot about the pivot, the locking leg is driven to move in a direction so as to cause the first engaging means to engage with a second engaging means provided adjacent to the first engaging means.

Other advantages and novel features of the present invention will become more apparent from the following detailed description of preferred embodiment when taken in conjunction with the accompanying drawings, in which:

DETAILED DESCRIPTION

Figure 1:
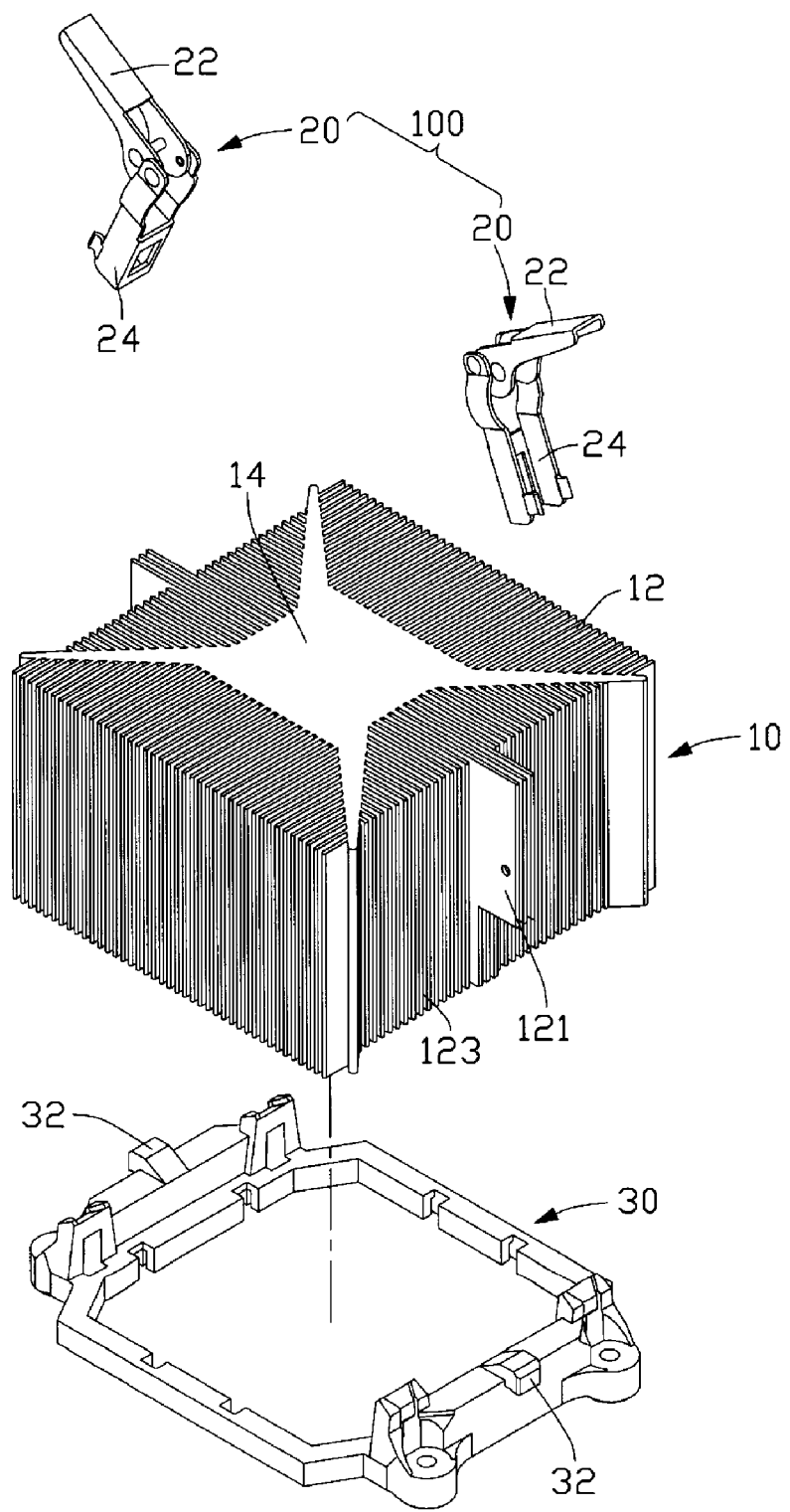
FIG. 1 is an exploded, isometric view of a heat sink assembly in accordance with an embodiment of the present invention.
Figure 2:
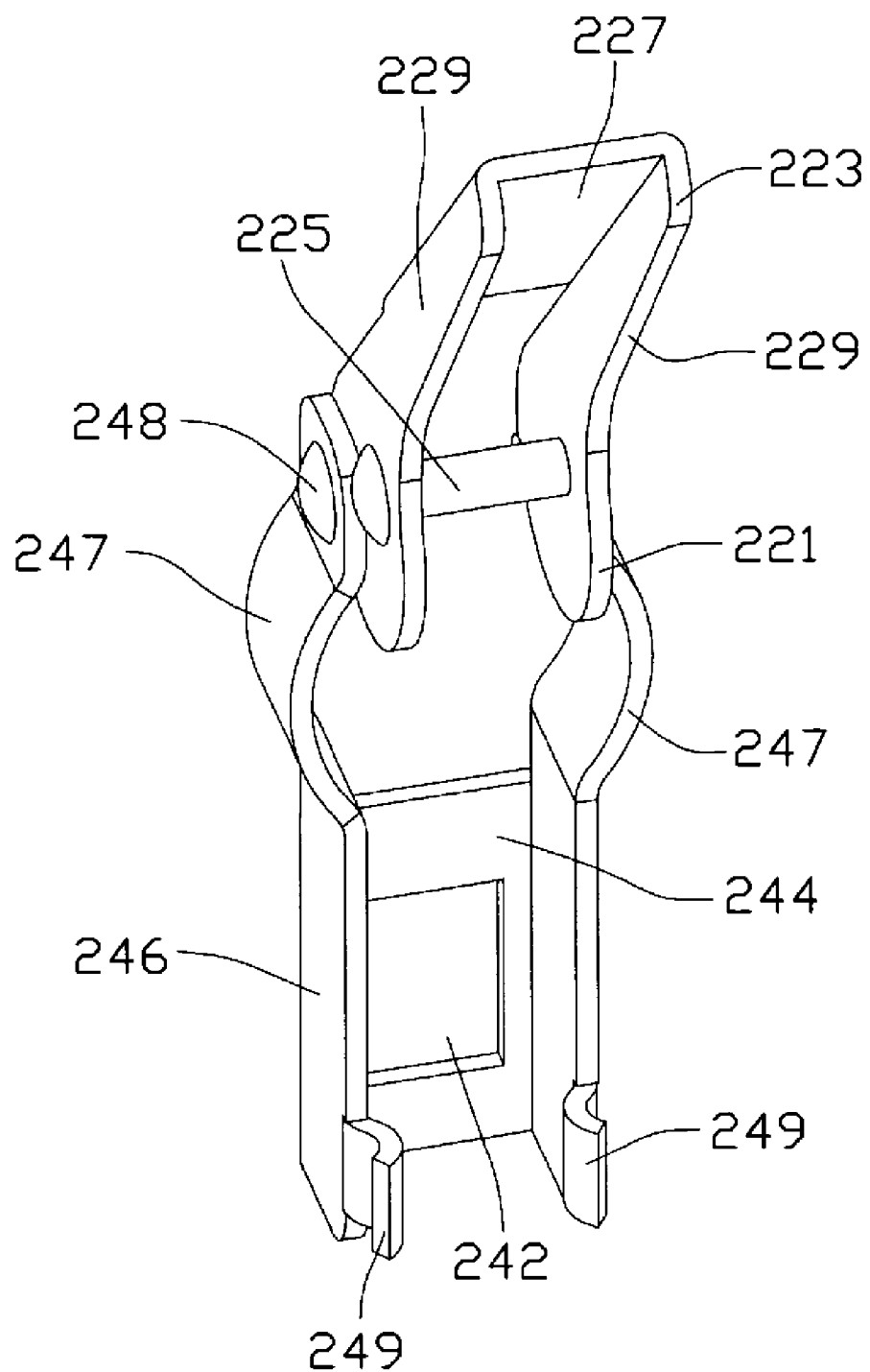
FIG. 2 is an enlarged, isometric view of a retainer of the heat sink assembly of FIG. 1.

FIGS. 1-2 illustrate a locking device 100 in accordance with an embodiment of the present invention. The locking device 100 includes a pair of retainers 20, and is applied to secure a heat sink 10 to a heat-generating component (not shown) such as a central processing unit (CPU) of a computer system, whereby the heat generated by the CPU is capable of being dissipated through the heat sink 10. The heat sink 10, which is made of a highly thermally conductive material such as aluminum, aluminum alloys, copper or copper alloys, includes a plurality of fins 12. Each of the retainers 20 includes a handle 22 and a locking leg 24.

Figure 3:
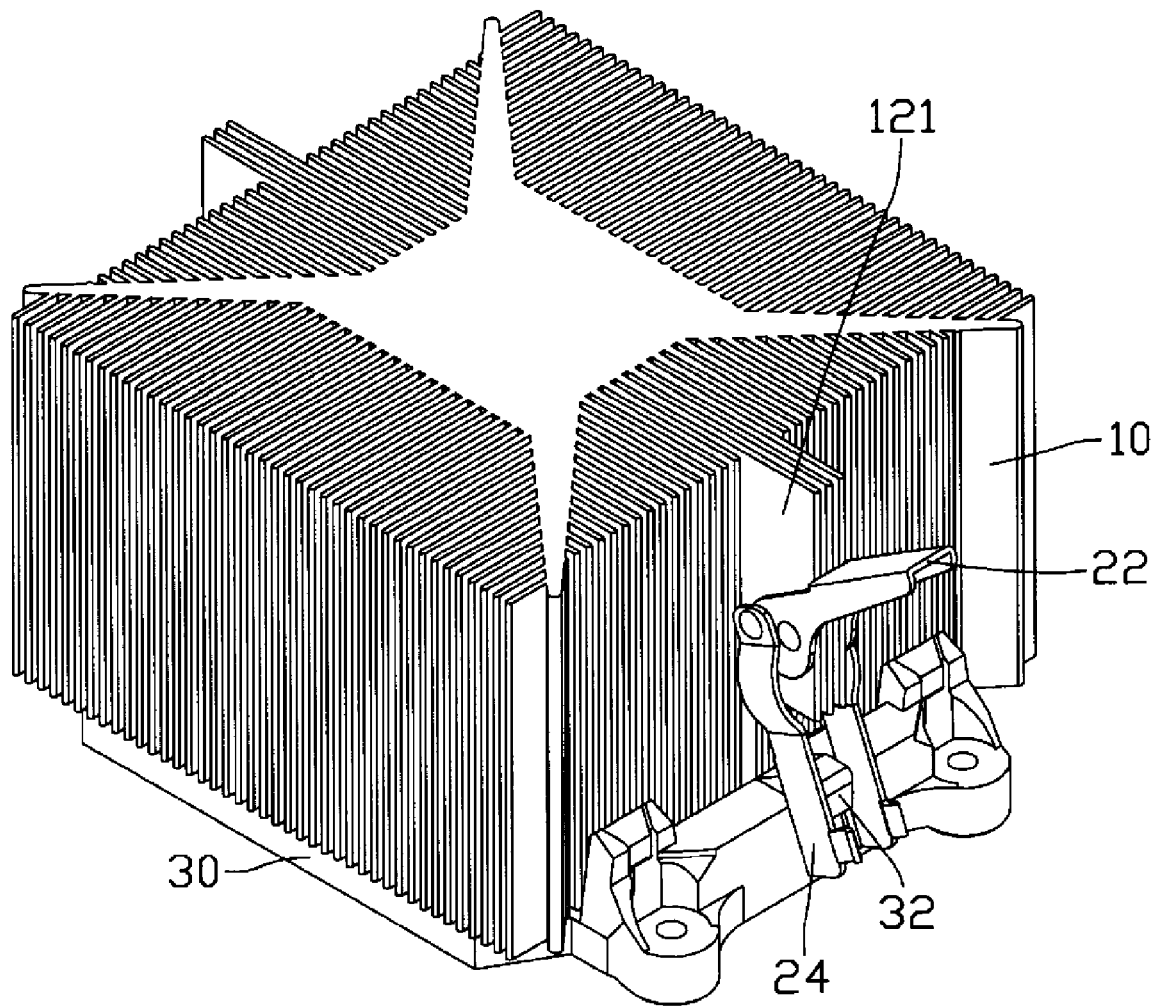
FIG. 3 is an assembled, isometric view of the heat sink assembly of FIG. 1, with the retainers thereof being located at a relaxed position.

In the particular embodiment illustrated, the heat sink 10 is secured to the CPU through a retention frame 30 which is provided with a pair of protrusions 32 at opposite sides thereof. The heat sink 10 includes a central core 14 wherein the fins 12 extend vertically and radially outwardly from the central core 14. The central core 14 is a solid metal column. In alternative embodiments, the central core 14 may be a conventionally known or as yet undeveloped heat pipe. The fins 12 are integrally formed with the central core 14 by extrusion, for example. Alternatively, the fins 12 may be formed independently of the central core 14 and coupled to the central core 14 subsequently via glueing or soldering. The fins 12 of the heat sink 10 include extended fins 121 and primary fins 123. The extended fins 121 are located at opposite sides of the heat sink 10 and have outmost portions (not labeled) which extend outwardly to a particular extent beyond the neighboring primary fins 123. At each of the opposite sides of the heat sink 10, there is at least one extended fin 121, three of which are shown in FIG. 3.

In the illustrated embodiment, the handle 22 of each retainer 20 includes a positioning end portion 221 and an operational end portion 223 extending from the positioning end portion 221. The positioning end portion 221 of the handle 22 is provided with a pivot 225, wherein the handle 22 is pivotable around the pivot 225. The handle 22 includes a top wall 227 and a pair of sidewalls 229 extending perpendicularly from a pair of opposite side edges of the top wall 227. The top wall 227 and the sidewalls 229 are integrally formed from a unitary sheet member such as a single metal sheet.

In the illustrated embodiment, the locking leg 24 of each retainer 20 includes a base plate 244 and a pair of side plates 246 extending perpendicularly from a pair of opposite side edges of the base plate 244. The base plate 244 and the side plates 246 are integrally made from a unitary sheet member such as a single metal sheet. For example, the side plates 246 may be formed by curving or bending opposite sides of a metal sheet relative to the remaining portion of the metal sheet whereby the remaining portion is formed as the base plate 244. The base plate 244 of the locking leg 24 defines a hole 242 adjacent to a bottom end portion of the locking leg 24 while a top end portion of the locking leg 24 is pivotably connected to the handle 22. In particular, a pair of buffers 247 extends respectively from the side plates 246 in a direction away from the hole 242 defined in the base plate 244. Each of the buffers 247 is stretchable and has a substantially C-shaped configuration. A free end of each of the buffers 247 is pivotably coupled to the positioning end portion 221 of the handle 22 via a hinge 248, wherein the hinge 248 is spaced apart from the pivot 225. With such a structural relationship, when the handle 22 of the retainer 20 are brought to pivot around the pivot 225, the locking leg 24 will accordingly be driven to move in a certain direction, e.g., upwardly or downwardly. The locking leg 24 further includes a pair of holding tabs 249 extending from the side plates 246, respectively, wherein the tabs 249 are located near the bottom end portion of the locking leg 24 and each has a substantially V-shaped configuration.

Figure 4:
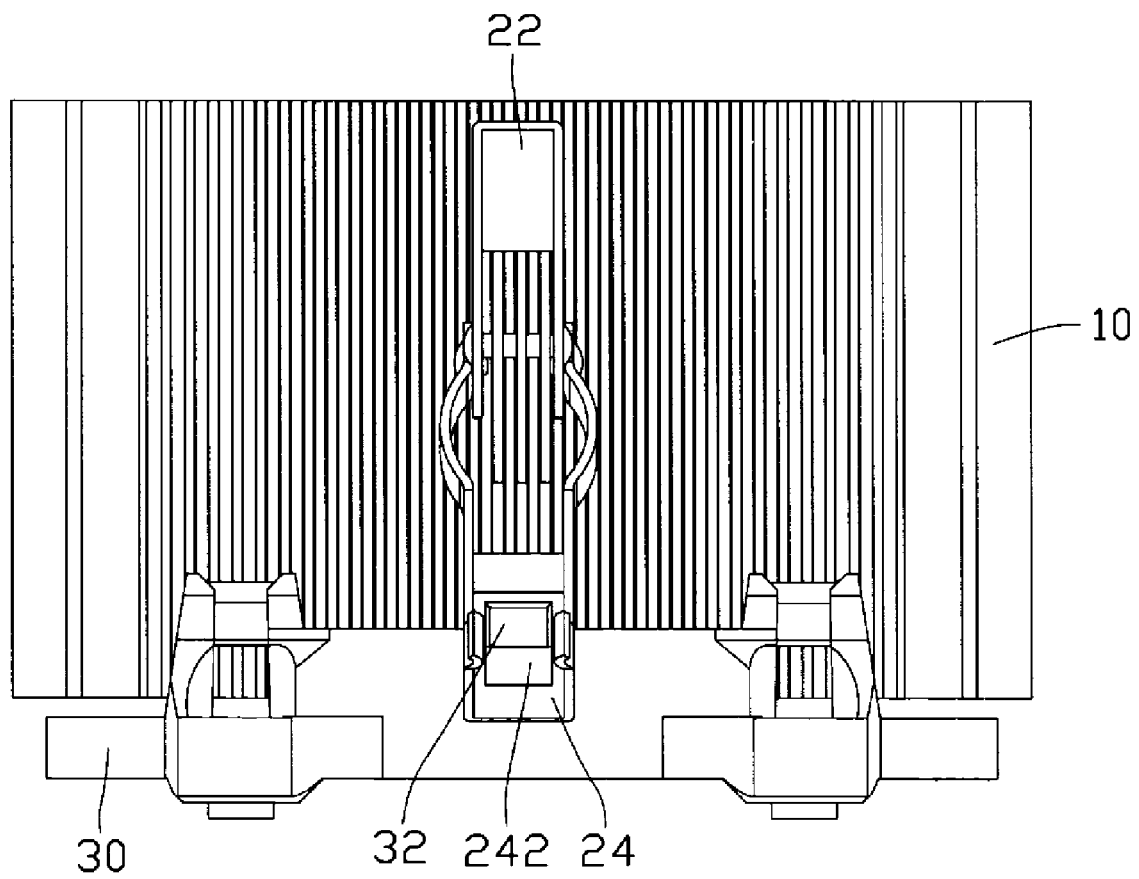
FIG. 4 is a side elevational view of the heat sink assembly of FIG. 3.

In assembly, the retention frame 30 is mounted to, for example, a printed circuit board (not shown) on which the CPU is installed. In particular, the retention frame 30 is so mounted as to surround the CPU therein. The heat sink 10 is seated on the retention frame 30 with the extended fins 121 thereof being aligned with the protrusions 32 of the retention frame 30. The retainers 20 of the locking device 100 are respectively mounted to the opposite sides of the heat sink 10. Specifically, the handle 22 of each retainer 20 is pivotably mounted by the pivot 225 to the outmost portions of the extended fins 121, which are formed at a respective side of the heat sink 10, as shown in FIGS. 3-4, wherein the handle 22 of each retainer 20 is located at a relaxed position. At this relaxed position, the handle is oriented outwardly and upwardly. The hole 242 of the locking leg 24 loosely receives the respective protrusion 32 of the retention frame 30 therein. The handle 22 is pivotable with respect to the heat sink 10 around the pivot 225, which is provided at the positioning end portion 221 of the handle 22.

Figure 5:
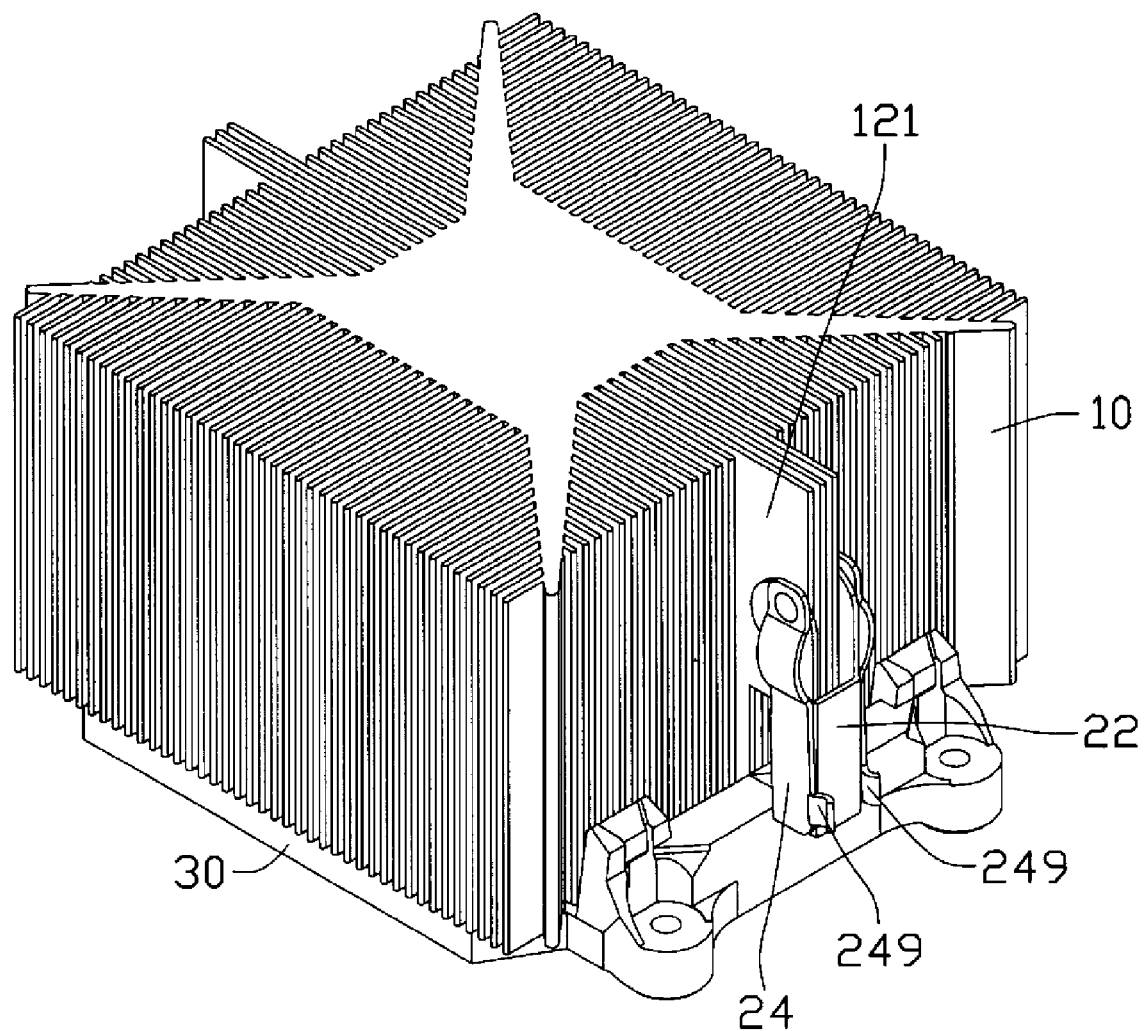
FIG. 5 is an assembled, isometric view of the heat sink assembly of FIG. 1, with the retainers thereof being located at a locked position.
Figure 6:
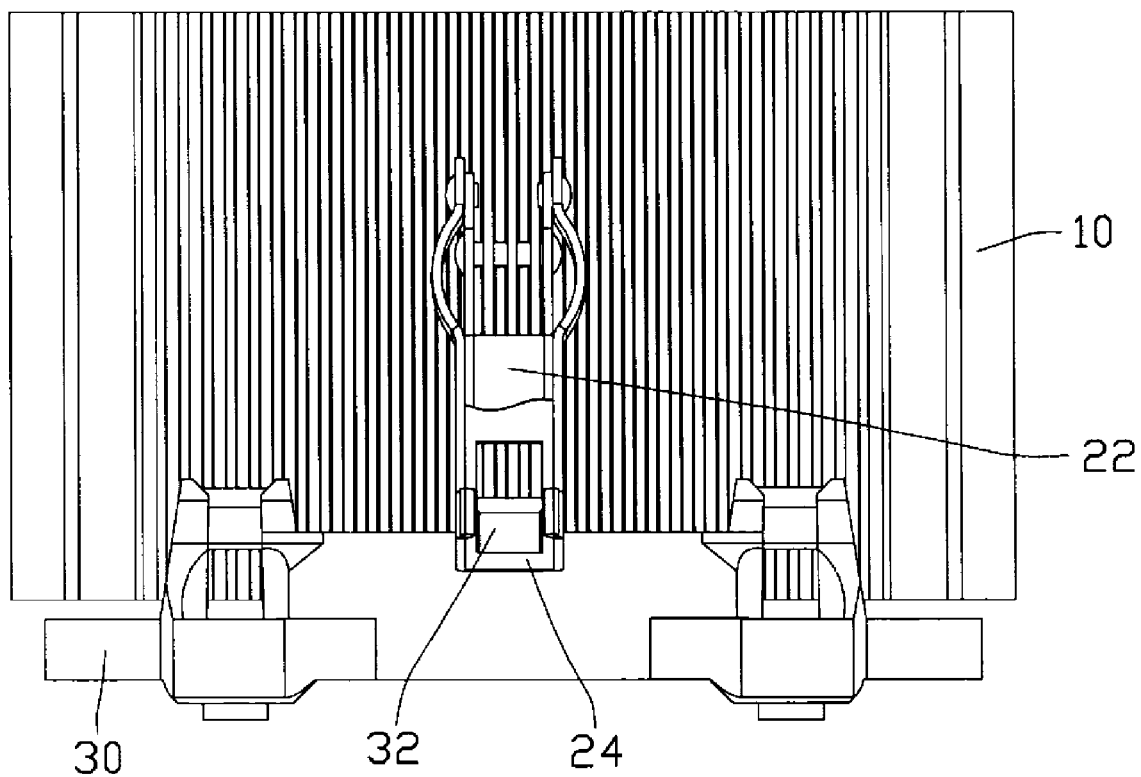
FIG. 6 is a side elevational view of the heat sink assembly of FIG. 3, with a portion of the handle of the retainer being removed away for purpose of illustration.

In operation, the handle 22 is pushed downwardly such that it pivots about the pivot 225 whereby the hinges 248 rotate around the pivot 225 and the locking leg 24 is driven to move upwardly. As the handle 22 is continuously pushed such that the operational end portion 223 of the handle 22 approaches the holding tabs 249 of the locking leg 24, the protrusions 32 of the retention frame 30 are brought to enter into engagement with the locking legs 24 in the holes 242, respectively, and the buffers 247 are stretched to generate a pressing force urging the heat sink 10 downwardly whereby a bottom surface of the heat sink 10 is brought into contact with the CPU to be cooled. After the operational end portion 223 of the handle 22 comes into physical contact with the holding tabs 249, the handle 22 is further pushed and as a result, the holding tabs 249 are deflected outwardly to enable the handle 22 to ultimately enter into a receiving space (not labeled) defined cooperatively by the base plate 244 and side plates 246 of the locking leg 24, as shown in FIGS. 5-6. At this moment, the handle 22 is located at a locked position. The handle 22 is stopped by the holding tabs 249, which is helpful to prevent the heat sink 10 from disengagement from the locked position. The protrusions 32 of the retention frame 30 are firmly engaged with the locking legs 24 in the holes 242, respectively, and the heat sink 10 is held downwardly by the pressing forces resulted from the buffers 247 due to their deformations, whereby the heat sink 10 is brought into intimate contact with the CPU to be cooled.

In the particular embodiment given, each retainer 20 of the locking device 100 has a simple structure and accordingly the manufacturing cost of the locking device 100 is relatively low. Furthermore, the locking device 100 is user-friendly since the securing of the heat sink 10 to the CPU to be cooled can be easily realized by pushing the handle 22 of each retainer 20, without requiring a large force by the user or operator. Moreover, the retainers 20 of the locking device 100 are located at opposite sides of the heat sink 10 and each retainer 20 occupies only a small mounting space (see FIG. 5) while securing the heat sink 10 firmly and stably to the CPU to be cooled. The heat sink 10 is not required to provide additional space for accommodating the locking device 100 and therefore the heat dissipation surface area of the heat sink 10 is not affected. Also, when the handle 22 is located at its locked position, the handle 22 is received in the receiving space defined by the locking leg 24, as described above, whereby the mounting space occupied by the locking device 100 is further reduced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A locking device for securing a heat sink to a heat-generating component comprising a pair of retainers, each retainer comprising:

a handle having a top wall and a pair of sidewalls extending perpendicularly from a pair of opposite side edges of the top wall, respectively, the sidewalls of the handle being provided with a pivot wherein the handle is pivotable around the pivot; and a locking leg being made from a unitary sheet member, the locking leg having a first engaging means provided at a first end portion thereof, a second end portion of the locking leg being connected to the sidewalls of the handle by a hinge positioned on the sidewalls and spaced apart from said pivot;

wherein when the handle is brought to pivot about said pivot, the locking leg is driven to move in a direction to cause said first engaging means to engage with a second engaging means provided adjacent to said first engaging means;

wherein the locking leg includes a base plate and the first engaging means is provided at the base plate;

wherein a pair of side plates extends from a pair of opposite side edges of the base plate, respectively, each of the side plates being perpendicular to the base plate; and wherein a holding tab extends from each of the side plates for holding the handle in a receiving space defined cooperatively by the base plate and side plates of the locking leg when the handle is located at a locked position.

2. The locking device of claim 1, wherein a buffer extends from each of the side plates in a direction away from the first engaging means, the free end of the buffer being connected to the sidewalls of the handle via the hinge, wherein when the handle is pivoted about said pivot, the hinge moves rotatably with respect to said pivot.

3. The locking device of claim 2, wherein the buffer has a substantially C-shaped configuration.

4. The locking device of claim 1, wherein the first engaging means comprises a hole.

5. A heat sink assembly comprising:
   a retention frame having a first engaging structure thereon;
   a heat sink mounted on the retention frame and having a plurality of fins for dissipation of heat;
   a retainer having a handle pivoted to the heat sink via a pivot extending through at least one of the fins, whereby the handle is pivotable relative to the heat sink between a first position and a second position, and a locking leg hinged to the handle and having a second engaging structure thereon;
   wherein when the handle is pivoted downwardly from the first to the second position, the second engaging structure is moved upwardly to tightly engage with the first engaging structure; and
   wherein the handle having a top wall and a pair of sidewalls extending perpendicularly from a pair of opposite side edges of the top wall, respectively, the sidewalls of the handle being provided with the pivot extending through at least one of the fins of the heat sink, and wherein the locking leg is connected to the sidewalls of the handle by a hinge positioned on the sidewalls and spaced apart from said pivot.

6. The heat sink assembly of claim 5, wherein the locking leg has a pair of side plates each forming a curved holding tab at a lower end thereof, when the handle is pivoted to the second position, the handle is received between the side plates and held in position by the holding tabs.

7. A heat sink assembly comprising:
   a retention frame having a first engaging structure thereon;
   a heat sink mounted on the retention frame and having a plurality of fins for dissipation of heat;
   a retainer having a handle pivoted to the heat sink via a pivot extending through at least one of the fins, whereby the handle is pivotable relative to the heat sink between a first position and a second position, and a locking leg hinged to the handle and having a second engaging structure thereon;
   wherein when the handle is pivoted downwardly from the first to the second position, the second engaging structure is moved upwardly to tightly engage with the first engaging structure; and
   wherein the locking leg has a pair of side plates each forming a curved holding tab at a lower end thereof, when the handle is pivoted to the second position, the handle is received between the side plates and held in position by the holding tabs.

* * * * *